(12) United States Patent
Honda et al.

(10) Patent No.: US 6,214,455 B1
(45) Date of Patent: Apr. 10, 2001

(54) BISPHENOL A AND NOVOLAK EPOXY RESINS WITH NITROGEN-CONTAINING PHENOLIC RESIN

(75) Inventors: Nobuyuki Honda; Tsuyoshi Sugiyama, both of Kawasaki; Tetsuaki Suzuki, Kawaguchi, all of (JP)

(73) Assignee: Toshiba Chemical Corporation, Tokyo (JP)

(*) Notice: Subject to any disclaimer, the term of this patent is extended or adjusted under 35 U.S.C. 154(b) by 0 days.

(21) Appl. No.: 09/302,230

(22) Filed: Apr. 29, 1999

Related U.S. Application Data

(62) Division of application No. 08/849,179, filed as application No. PCT/JP95/01988 on Sep. 29, 1995, now Pat. No. 5,955,184.

(51) Int. Cl.$^7$ .......................... B32B 17/04; C08L 63/02; C08L 63/04
(52) U.S. Cl. ..................................... 428/299.4; 428/297.4; 428/415; 428/416; 428/901; 428/921; 525/485; 525/486; 525/490; 525/524
(58) Field of Search .................... 428/297.4, 299.4, 428/415, 416, 901, 921; 525/500, 504, 524, 490, 485, 486; 528/99, 103

(56) References Cited

U.S. PATENT DOCUMENTS 4,501,787  2/1985  Marchetti et al. .................. 428/326

FOREIGN PATENT DOCUMENTS

| | | |
|---|---|---|
| 51-129498 | 11/1976 | (JP) . |
| 55-069616 | 5/1980 | (JP) . |
| 57-195119 | 11/1982 | (JP) . |
| 58-189219 | 11/1983 | (JP) . |
| 59-210935 | 11/1984 | (JP) . |
| 60-124630 | 7/1985 | (JP) . |
| 1-079253 | 3/1989 | (JP) . |
| 64-79253 | 3/1989 | (JP) . |
| 4-227923 | 8/1992 | (JP) . |
| 5-318653 | 12/1993 | (JP) . |

*Primary Examiner*—Robert E. L. Sellers
(74) *Attorney, Agent, or Firm*—John P. White; Cooper & Dunham LLP

(57) ABSTRACT

Disclosed in a halogen-free flame-retardant epoxy resin composition, comprising (A) a bisphenol A type epoxy resin, (B) a novolak type epoxy resin, (C) a phenolic resin type curing agent, (D) a curing accelerator, and (E) an inorganic filler. The phenolic resin type curing agent (C) is provided by a nitrogen-containing phenolic resin, preferably, by a co-condensation resin formed by the reaction among a phenolic compound, a guanamine compound, and an aldehyde compound. More desirably, a phenolic resin containing both phosphorus and nitrogen should be used as the curing agent (C). Further, a combination of the co-condensation resin noted above (C-1) and a reactive phosphoric acid ester can be used as a curing agent.

4 Claims, No Drawings

BISPHENOL A AND NOVOLAK EPOXY RESINS WITH NITROGEN-CONTAINING PHENOLIC RESIN

This application is a divisional of U.S. Ser. No. 08/849, 179, filed May 28, 1997, U.S. Pat. No. 5,955,184, which is a §371 of PCT/JP95/01988, filed Sept. 29, 1995.

TECHNICAL FIELD

The present invention relates to an epoxy resin composition as well as a prepreg and a laminate containing the composition, and more particularly to a halogen-free flame-retardant epoxy resin composition, a prepreg impregnated with such composition, as well as to a laminate, copper-clad laminate and printed wiring board manufactured by using such prepreg.

BACKGROUND ART

In recent years, safety to humans including, for example, the air pollution problem attracts world-wide attentions. In this connection, electric and electronic appliances are required to be more harmless and more safe in addition to the requirement of a high flame retardancy. To be more specific, the electric and electronic appliances are required to be resistant to flame and, at the same time, not to generate noxious gases. It has been customary in the past to use a glass/epoxy as a substrate of a printed wiring board on which electric and electronic appliances are to be mounted. In general, a brominated epoxy resin containing bromine as a flame-retardant, particularly, tetrabromobisphenol-A type epoxy resin, is used for forming the substrate of the printed wiring board.

The brominated epoxy resin certainly exhibits a high flame retardancy, but generates a noxious hydrogen halide (hydrogen bromide) gas when burned. To overcome the difficulty, epoxy resin compositions containing non-halogen flame-retardants such as nitrogen compounds, phosphorus compounds, inorganic compounds, etc., have been developed, as reported in, for example, British Patent No. 1,112,139 and Japanese Patent Disclosure (Kokai) No. 2-269730, However, these flame-retardants give rise to a detrimental effect to the curing of the epoxy resin and impairs the humidity resistance of the cured composition. In addition, a glass cloth is less likely to be impregnated with the epoxy resin composition if the composition contains the non-halogen flame-retardants mentioned.

The present invention is intended to provide an epoxy resin composition which does not contain a halogen element but exhibits a good flame retardancy and which permits overcoming the above-noted problems inherent in the prior art.

The present invention is also intended to provide a prepreg impregnated with such an epoxy resin composition as well as a laminate, copper-clad laminate and printed wiring board using such a prepreg sheet.

DISCLOSURE OF INVENTION

According to a first embodiment of the present invention, there is provided a halogen-free flame-retardant epoxy resin composition, comprising (A) a bisphenol A type epoxy resin, (B) a novolak type epoxy resin, (C) a nitrogen-containing phenolic resin acting as a curing agent, (D) a curing accelerator, and (E) an inorganic filler, wherein the nitrogen-containing henolic resin serves to impart a flame retardancy to the composition.

The nitrogen-containing phenolic resin may be an aminophenolic resin. However, it is preferable to use a co-condensation resin formed by the reaction among a phenolic compound, a guanamine compound and an aldehyde compound.

According to a second embodiment of the present invention, there is provided a halogen-free flame-retardant epoxy resin composition, comprising (A) a bisphenol A type epoxy resin, (B) a novolak type epoxy resin, (C) a phosphorus- and nitrogen-containing phenolic resin acting as a curing agent, (D) a curing accelerator, and (E) an inorganic filler, wherein the phosphorus- and nitrogen-containing phenolic resin serves to impart a flame retardancy to the composition.

The phenolic resin containing both phosphorus and nitrogen atoms should desirably be a reaction product among a phenolic compound, a guanamine compound, an aldehyde compound and a reactive phosphoric acid ester.

According to a third embodiment of the present invention, there is provided a halogen-free flame-retardant epoxy resin composition, comprising (A) a bisphenol A type epoxy resin, (B) a novolak type epoxy resin, (C-1) a reactive phosphoric acid ester, (C-2) a co-condensation resin of a phenolic compound, a guanamine compound, and an aldehyde compound, (D) a curing accelerator, and (E) an inorganic filler.

The present invention also provides a prepreg impregnated with the halogen-free flame-retardant epoxy resin composition according to the present invention as well as a laminate, copper-clad laminate and printed wiring board prepared by using the prepreg.

BEST MODE OF CARRYING OUT THE INVENTION

The present invention will be described in detail below.

The epoxy resin composition of the present invention contains a bisphenol A type epoxy resin as component (A). As widely known to the art, the bisphenol A type epoxy resin is a reaction product between bisphenol A and, for example, epichlorohydrin. The bisphenol A type epoxy resin used in the present invention generally has an epoxy equivalent of at least 170, However, it is undesirable for the epoxy equivalent to exceed 1,000 because the resultant composition is less likely to be impregnated into a glass cloth. The bisphenol A type epoxy resin used in the present invention is commercially available including, for example, EPIKOTE series manufactured by Yuka Shell Inc., Japan and ARALDITE series manufactured by Ciba Geigy Inc. It is possible to use a single kind or a plurality of different kinds of the bisphenol A type epoxy resin in the resin composition of the present invention.

A novolak type epoxy resin is used as component (B) in the epoxy resin composition of the present invention. As widely known to the art, the novolak type epoxy resin is a resin obtained by a reaction between a novolak resin and epichlorohydrin. The novolak resin is a resin obtained by a condensation reaction between a phenolic compound and formaldehyde, which is carried out in the presence of an acidic catalyst. The phenolic compounds used for producing the novolak resin by the reaction with formaldehyde include, for example, phenol, cresol, and bisphenol A. The novolak type epoxy resin used in the present invention should desirably have a softening point of 70 to 130° C., more preferably, 80 to 100° C. Such a novolak resin is commercially available from, for example, Toto Kasei K.K., Japan and Dai-Nippon Ink and Chemicals, Inc. It is possible to use a single kind or a plurality of different kinds of novolak type epoxy resins in preparing the resin composition of the present invention.

The epoxy resin composition of the present invention also comprises as a curing agent (C) a phenolic resin containing nitrogen in the resin molecule. The nitrogen-containing phenolic compound serves to impart a flame retardancy to the epoxy resin composition. Needless to say, the phenolic resin is a reaction product between a phenolic compound and an aldehyde compound such as formaldehyde. The nitrogen atom contained in the nitrogen-containing phenolic resin may be present in any of the phenolic resin. For example, the nitrogen atom may be provided by an amino group substituted on the phenolic ring. In other words, an aminophenolic resin is an example of the nitrogen-containing phenolic resin used in the present invention.

However, in a preferred embodiment of the present invention, the nitrogen-containing phenolic resin is provided by a co-condensation resin among a phenolic compound, a guanamine compound and an aldehyde compound.

The co-condensation resin can be prepared by reacting a phenolic compound, an aldehyde compound and a guanamine compound, in the presence of an acid catalyst such as oxalic acid or p-toluene sulfonic acid. In carrying out the reaction, it is preferred that the molar ratio of the aldehyde compound to the phenolic compound should be less than 1.0, preferably 0.5 to less than 1.0, and one mole of aldehyde compound should be used for one primary amino group ($-NH_2$) contained in the guanamine compound (for example, in the case of using melamine as the guanamine compound, it is desirable to use 3 moles of formaldehyde relative to one mol of melamine. Likewise, in the case of using benzoguanamine, it is desirable to use 2 moles of formaldehyde relative to one mol of benzoguanamine).

The phenolic compounds used include, for example, phenol, resorcin, and alkyl phenols such as cresol and xylenol.

It is particularly desirable to use formaldehyde as the aldehyde compound.

The guanamine compound can be represented by the general formula given below:

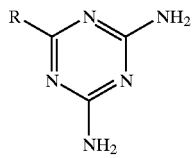

where R is amino, phenyl or alkyl such as methyl.

The guanamine compounds used in the present invention include, for example, melamine, benzoguanamine, and methyl guanamine. It is possible to use the guanamine compounds singly or as a mixture of a plurality of different kinds of compounds.

Where the nitrogen-containing phenolic resin described above is used as a curing agent, the particular resin and a filler, which will be described later, produce a mutual function to impart a sufficient flame retardancy to the resultant composition. However, in the case of manufacturing a copper-clad glass epoxy laminate or a printed wiring board by using the epoxy resin composition of the present invention, it is more desirable to use as a curing agent a phenolic resin containing both nitrogen and phosphorus atoms in the resin molecule. In the case of using the particular phenolic resin, the tracking resistance of the resultant resin composition can be more improved.

The phosphorus- and nitrogen-containing phenolic resin can be prepared from the phenolic compound, guanamine compound, aldehyde compound described above, and a reactive phosphoric acid ester. In this reaction, the phenolic compound, guanamine compound and aldehyde compound are used in the molar ratio equal to that in the case of preparing the co-condensation resin described above. On the other hand, it is desirable to use the reactive phosphoric acid ester such that two moles of aldehyde compound contained in the resultant composition is used for one free hydroxyl group of the reactive phosphoric acid ester.

The phosphorus- and nitrogen-containing phenolic resin can be prepared by, for example, a single stage reaction among a phenolic compound, a guanamine compound, an aldehyde compound and a reactive phosphoric acid ester. Alternatively, it is possible to prepare in advance a co-condensation resin among a phenolic compound, a guanamine compound and an aldehyde compound, followed by allowing an aldehyde compound and a reactive phosphoric acid ester to react with the resultant co-condensation resin so as to obtain the desired phosphorus- and nitrogen-containing phenolic resin. In any of these single stage reaction and the two-stage reaction, the phenolic compound, guanamine compound, aldehyde compound and reactive phosphoric acid ester are used in the ratio described previously. It follows that, in the case of preparing in advance the co-condensation resin, the sum of the aldehyde compound used for preparation of the co-condensation resin and the aldehyde compound used for the reaction with the co-condensation resin should be set to meet the ratio described previously.

The reactive phosphoric acid ester can be obtained by the reaction between three phenolic compound molecules and one phosphorus oxytrichloride molecule. It is necessary for at least one of the three phenolic molecules to have at least two hydroxyl groups. The phenolic compounds having at least two hydroxyl groups include, for example, resorcin and pyrogallol. The reactive phosphoric acid ester used in the present invention can be represented by the general formula given below:

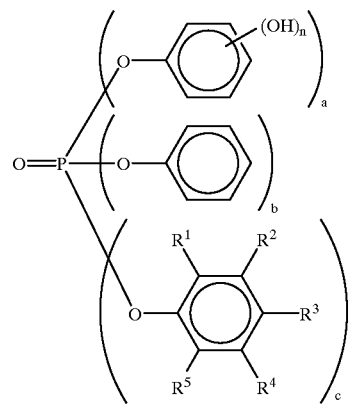

where a+b+c=3; a is 1, 2 or 3; b is 0, 1 or 2; c is 0, 1 or 2; n is 1 or 2; each of $R^1$, $R^2$, $R^3$, $R^4$ and $R^5$ is a hydrogen atom or an alkyl group such as methyl, at least one of these $R^1$ to $R^5$ being an alkyl. The reactive phosphoric acid ester used in the present invention includes, for example, resorcyl diphenyl phosphate, which is commercially available from Ajinomoto K.K., Japan, under the trade name of RDP.

As described previously, a co-condensation resin formed by the reaction among a phenolic compound, a guanamine compound and an aldehyde compound can be reacted in advance with a reactive phosphoric acid ester. In this case, the reaction product is added to the epoxy resin. Alternatively, these co-condensation resin and reactive phosphoric acid ester can be added separately to the epoxy resin. In this case, it is necessary to use 5 to 30 parts by weight of the reactive phosphoric acid ester (component C-1) relative to 70 to 95 parts by weight of the co-condensation resin among the phenolic resin, guanamine compound and aldehyde compound (component C-2). If the amount of component C-1 is smaller than 5 parts by weight, it is impossible to obtain a sufficient resistance to tracking. If the amount exceeds 30 parts by weight, however, the humidity resistance tends to be lowered.

Compounds generally used for accelerating the curing of an epoxy resin can be used as the curing accelerator (D) in the epoxy resin composition of the present invention. To be more specific, the curing accelerator (D) includes, for example, imidazole compounds such as 2-ethyl-4-methylimidazole and 1-benzyl-2-methylimidazole. These compounds can be used singly or in the form of a mixture. The curing accelerator should be used in a small amount as far as the accelerator is sufficient for accelerating the curing of the epoxy resin.

The inorganic filler (E) contained in the epoxy resin composition of the present invention serves to impart an additional flame retardancy, a heat resistance and a humidity resistance to the epoxy resin composition. The filler (E) used in the present invention includes, for example, talc, silica, alumina, aluminum hydroxide, and magnesium hydroxide. These materials can be used singly or in the form of a mixture.

To reiterate, the halogen-free flame-retardant epoxy resin composition of the present invention comprises components (A), (B), (C), (D) and (E). It is desirable to use the inorganic filler (E) in an amount of 5 to 50 parts by weight based on the total amount of these components (A) to (E). If the amount of the filler (E) is smaller than 5 parts by weight, it is impossible to obtain a sufficient flame retardancy, heat resistance and humidity resistance. If the amount exceeds 50 parts by weight, however, the viscosity of the resultant resin composition is increased, giving rise to various difficulties: for example, it is difficult to coat uniformly a substrate such as a glass unwoven fabric or a glass woven fabric with the epoxy resin composition; voids are generated in the coating; further, the laminate using the epoxy resin composition are rendered uneven in thickness.

Also, it is desirable to use the resin solid components, i.e., components (A)+(B)+(C)+(D), in an amount of 50 to 95% by weight based on the total amount of the components (A) to (E). As described previously, it suffices to use component (D) in a small amount, e.g., about 0.01 to 1% by weight.

It is preferred that the epoxy resin components (A) and (B), and the phenolic resin component (C), or (C-1)+(C-2), are mixed such that 0.8 to 1.2, preferably 0.95 to 1.05 epoxy equivalents are present per hydroxyl equivalent in the total resin composition. In this case, the epoxy resin components should be added in an amount of about 51 to 80% by weight based on the total amount of the resin components of the composition.

Preferably, the bisphenol A type epoxy resin (A) should be added in an amount of 60 to 95% by weight based on the total amount of the resin (A) and the novolak type epoxy resin (B).

In the present invention, it is most preferable to use the component (C), or components (C-1) and (C-2) in amounts such that the resultant resin composition contains 1 to 10% by weight, preferably 4 to 7% by weight, of nitrogen atoms and 0.5 to 3% by weight, preferably 0.8 to 1.5% by weight, of phosphorus atoms, in order to obtain an epoxy resin composition exhibiting excellent flame retardancy and tracking resistance.

A prepreg of the present invention can be manufactured by the ordinary method. Specifically, the resin composition is diluted with a suitable organic solvent such as propylene glycol monomethyl ether to prepare varnish, followed by coating or impregnating a porous glass substrate such as a glass unwoven fabric or a glass woven fabric with the varnish and subsequently heating the substrate to obtain a desired prepreg. The prepreg thus prepared can be used for manufacturing a copper-clad laminate. In this case, a plurality of prepregs are laminated one upon the other, followed by superposing a copper foil on one or both surfaces of the laminated plate. Further, the resultant structure is subjected to heating and pressurizing under the ordinary conditions to obtain a desired copper-clad glass epoxyl laminate. A laminate can be obtained, if the copper foil is not superposed on the laminate of the prepreg sheets in the above-noted process of manufacturing a copper-clad laminate. A multi-layered laminate can also be prepared by using the copper-clad laminate. In this case, the copper foil of the laminate (inner laminate) is selectively etched to form a circuit pattern. Then, a laminate and a copper foil are superposed on one surface of the inner laminate, followed by pressurizing the resultant structure by the ordinary method, e.g., under pressure of 40 kg/cm$^2$ for 90 minutes at 170° C., thereby obtaining a desired multi-layered laminate. Further, a printed wiring board can be manufactured by the ordinary method such that through holes are made first in the copper-clad laminate or multi-layered laminate, followed by applying a through-hole plating and subsequently forming a desired circuit.

Examples of the present invention will be described as follows.

MANUFACTURING EXAMPLE A 0.1 part by weight of oxalic acid was added to a mixture consisting of 56 parts by weight of benzoguanamine, 300 parts by weight of formalin (aqueous solution containing 37% by weight of formaldehyde), and 367 parts by weight of phenol. The resultant mixture was subjected to reaction for 2 hours at 80° C., followed by dehydrating the reaction mixture under a reduced pressure. Further, methyl ethyl ketone was added to the dehydrated reaction mixture to adjust the resin solid component (phenol/benzoguanamine/formaldehyde co-condensation resin) at 70% by weight. The co-condensation resin thus prepared was found to contain 4% by weight of nitrogen.

MANUFACTURING EXAMPLE B

A mixture consisting of 18 parts by weight of melamine, 28 parts by weight of benzoguanamine and 50 parts by weight of formalin was subjected to reaction for 30 minutes at 80° C. Then, 367 parts by weight of phenol and 250 parts by weight of formalin were added to the reaction mixture, followed by further adding 0.1 part by weight of oxalic acid to the reaction mixture. The resultant reaction mixture was subjected to reaction for 2 hours at 80° C., followed by dehydration under a reduced pressure. Further, methyl ethyl ketone was added to the dehydrated reaction mixture to adjust the resin solid component (phenol/melamine/benzoguanamine/formaldehyde co-condensation resin) at 70% by weight. The co-condensation resin thus prepared was found to contain 4% by weight of nitrogen.

MANUFACTURING EXAMPLE C 0.1 part by weight of oxalic acid was added to a mixture consisting of 50 parts by weight of benzoguanamine, 214 parts by weight of formalin, 248 parts by weight of phenol, and 36 parts by weight of RDP (resorcyl diphenyl phosphate available from Ajinomoto K.K., Japan). The resultant mixture was subjected to reaction for 2 hours at 80° C., followed by dehydrating the reaction mixture under a reduced pressure. Further, methyl ethyl ketone was added to the dehydrated reaction mixture to adjust the resin solid component (phosphorus-modified benzoguanamine/phenol/formaldehyde co-condensation resin) at 70% by weight. The co-condensation resin thus prepared was found to contain 4% by weight of nitrogen and 1% by weight of phosphorus.

MANUFACTURING EXAMPLE D

A mixture consisting of 92.5 parts by weight of benzoguanamine, 218 parts by weight of formalin, 212 parts by weight of phenol, and 115 parts by weight of RDP referred to previously was subjected to reaction under the conditions equal to those in Manufacturing Example C to obtain the desired phenolic resin containing phosphorus atoms nitrogen atoms. Specifically, the phenolic resin thus obtained was found to contain 8% by weight of nitrogen and 2% by weight of phosphorus.

EXAMPLE 1

Propyleneglycol monomethyl ether (PGM) acting as a solvent was added to a mixture consisting of 260 parts by weight of EPIKOTE 1001 (a bisphenol A type epoxy resin available from Yuka Shell Inc., Japan, having an epoxy equivalent of 456 and a resin solid of 70% by weight), 65 parts by weight of YDCN-704P (cresol novolak epoxy resin available from Toto Kasei K.K., Japan, having an epoxy equivalent of 210 and a solid component of 70% by weight), 128 parts by weight of the nitrogen- and phosphorus-containing phenolic resin prepared in Manufacturing Example C, 175 parts by weight of aluminum hydroxide, and 0.1 part by weight of 2-ethyl-4-methylimidazole, so as to prepare an epoxy resin varnish containing 65% by weight of the resin solid component.

EXAMPLE 2

PGM was added to a mixture consisting of 260 parts by weight of EPIKOTE 1001 noted above, i.e., a bisphenol A type epoxy resin, 65 parts by weight of YDCN-704P noted above, i.e., cresol novolak epoxy resin, 184 parts by weight of the nitrogen- and phosphorus-containing phenolic resin prepared in Manufacturing Example D, 150 parts by weight of aluminum hydroxide, and 0.1 part by weight of 2-ethyl-4-methylimidazole, so as to prepare an epoxy resin varnish containing 65% by weight of the resin solid component.

EXAMPLE 3

PGM was added to a mixture consisting of 260 parts by weight of EPIKOTE 1001 noted above, i.e., a bisphenol A type epoxy resin, 65 parts by weight of YDCN-704P noted above, i.e., cresol novolak epoxy resin, 206 parts by weight of the nitrogen- and phosphorus-containing phenolic resin prepared in Manufacturing Example C, 150 parts by weight of aluminum hydroxide, and 0.1 part by weight of 2-ethyl-4-methylimidazole, so as to prepare an epoxy resin varnish containing 65% by weight of the resin solid component.

EXAMPLE 4

PGM was added to a mixture consisting of 260 parts by weight of EPIKOTE 1001 noted above, i.e., a bisphenol A type epoxy resin, 65 parts by weight of YDCN-704P noted above, i.e., cresol novolak epoxy resin, 105 parts by weight of the co-condensation resin prepared in Manufacturing Example A, 200 parts by weight of aluminum hydroxide, and 0.1 part by weight of 2-ethyl-4-methylimidazole, so as to prepare an epoxy resin varnish containing 65% by weight of the resin solid component.

EXAMPLE 5

PGM was added to a mixture consisting of 260 parts by weight of EPIKOTE 1001 noted above, i.e., a bisphenol A type epoxy resin, 65 parts by weight of YDCN-704P noted above, i.e., cresol novolak epoxy resin, 105 parts by weight of the co-condensation resin prepared in Manufacturing Example A, 30 parts by weight of RDP referred to previously, 175 parts by weight of aluminum hydroxide, and 0.1 part by weight of 2-ethyl-4-methylimidazole, so as to prepare an epoxy resin varnish containing 65% by weight of the resin solid component.

Control 1

PGM was added to a mixture consisting of 283 parts by weight of brominated epoxy resin (available from Dai-Nippon Ink and Chemicals Inc., having an epoxy equivalent of 490 and a solid component of 75% by weight), 34 parts by weight of YDCN-704P noted above, i.e., cresol novolak epoxy resin, 92 parts by weight of bisphenol A type novolak resin (available from Dai-Nippon Ink and Chemicals Inc., having a hydroxyl value of 118 and a solid component of 70% by weight), 130 parts by weight of aluminum hydroxide, and 0.1 part by weight of 2-ethyl-4-methylimidazole, so as to prepare an epoxy resin varnish containing 65% by weight of the resin solid component.

Control 2

Dimethylformamide was added to a mixture consisting of 360 parts by weight of brominated epoxy resin used in Control 1, 43 parts by weight of YDCN-704P noted above, i.e., cresol novolak epoxy resin, 7.5 parts by weight of dicyandiamide, 130 parts by weight of aluminum hydroxide, and 0.1 part by weight of 2-ethyl-4-methyl imidazole, so as to prepare an epoxy resin varnish containing 65% by weight of the resin solid component.

A glass unwoven fabric or a glass cloth was continuously coated or impregnated with the epoxy resin varnish prepared in each of Examples 1 to 5 and Controls 1 and 2, followed by drying the fabric to obtain a prepreg. Eight prepregs thus obtained were laminated one upon the other, followed by superposing a copper foil 18 μm thick on each of the two surfaces of the resultant lamiante. Then, a pressure of 40 kg/cm$^2$ was kept applied for 90 minutes to the laminate at 170° C. so as to obtain a copper-clad laminate having a thickness of 1.6 mm. Various properties of the copper-clad laminate were measured including the flame retardancy, tracking resistance, insulation resistance, peeling strength of the copper foil (initial value and the long-term deterioration), heat resistance and humidity resistance. Table 1 shows the results.

| | Composition | | | | | | |
|---|---|---|---|---|---|---|---|
| | Example | | | | | Control | |
| Properties | 1 | 2 | 3 | 4 | 5 | 1 | 2 |
| Flame retardancy *1 | V-1 | V-0 | V-0 | V-0 | V-0 | V-0 | V-0 |
| Tracking resistance *2 | 300 V | 600 V | 600 V | 200 V | 600 V | 200 V | 200 V |
| Insulation resistance *3 | 5.0 | 2.0 | 0.75 | 5.0 | 3.0 | 2.0 | 2.0 |

-continued

| Properties | | Composition Example | | | | | Control | |
|---|---|---|---|---|---|---|---|---|
| | | 1 | 2 | 3 | 4 | 5 | 1 | 2 |
| Peeling strength of copper foil *4 | Initial | 1.50 | 1.60 | 1.65 | 1.60 | 1.55 | 1.50 | 1.60 |
| | Long-term Deterioration | 1.45 | 1.60 | 1.60 | 1.60 | 1.50 | 0.90 | 0.95 |
| Heat resistance *5 | 5 min. | ⊚ | ⊚ | ⊚ | ⊚ | ⊚ | ⊚ | ⊚ |
| | 10 min. | ⊚ | ⊚ | ⊚ | ⊚ | ⊚ | ⊚ | ⊚ |
| | 15 min. | ⊚ | ⊚ | ⊚ | ⊚ | ⊚ | ⊚ | ○ |
| | 20 min. | ⊚ | ⊚ | ⊚ | ⊚ | ○ | ○ | △ |
| Humidity resistance *6 | Condition A | ⊚ | ⊚ | ⊚ | ⊚ | ⊚ | ⊚ | ⊚ |
| | Condition B | ⊚ | ⊚ | ○ | ⊚ | △ | ⊚ | ○ |

*1: Measured by the flame retardance test specified in UL94
*2: Measured by the method specified in IEC-PB 112
*3: Measured by the method specified in JIS-C-6481, the unit being "Ω (× $10^{13}$)"
*4: Measured by the method specified in JIS-C-6481, the unit being "KN/m"
*5: The sample was kept floating on a solder bath of 260° C. for the time indicated in TABLE 1 and, then blister of the sample was visually observed. The evaluation given in TABLE 1 is as follows:
⊚ . . . No blistering; ○ . . . Blistering in small region;
△ . . . Swelling in large region; X . . . Blistering over entire region
*6: The sample was put under condition A (boiling for 6 hours) or condition B (left to stand for 7 hours within steam of 120° C. and 2 atoms) and, then, dipped in a solder bath of 260° C. for 30 seconds. Then, blistering of the sample was visually observed and evaluated as follows:
⊚ . . . No blistering; ○ . . . Blistering in small region;
△ . . . Blistering in large region; X . . . Blistering over entire region

EXAMPLE 6

A glass unwoven fabric or a glass woven fabric was continuously coated or impregnated with the epoxy resin varnish obtained in Example 2 and, then, dried at 160° C. to obtain a prepreg. Eight prepregs thus prepared were laminated one upon the other, followed by pressurizing the laminate structure with pressure of 40 kg/cm² for 90 minutes at 170° C. to obtain a glass epoxy laminate. The flame retardancy, tracking resistance, insulation resistance and humidity resistance of the laminate were measured by the methods described previously, to obtain the results given below:

Flame retardance: V-0
Tracking resistance: 600V
Insulation resistance: 2.0Ω
Humidity resistance
  Condition A: ⊚
  Condition B: ⊚

EXAMPLE 7

Prepregs prepared as in Example 6 were laminated one upon the other, followed by superposing a copper foil 35 μm thick on each of both surfaces of the laminate structure. Further, the resultant laminate structure was pressurized under heat as in Example 6 to prepare an inner laminate having a thickness of 0.8 mm. An additional prepreg sheet was further laminated on each of both surfaces of the inner laminate, followed by superposing an additional copper foil 18 μm thick on each of the prepregs. Further, the resultant structure was pressurized under heat as in Example 6 to obtain a multi-layered laminate having a thickness of 1.6 mm. The resultant multi-layered laminate was put under condition A (boiling for 6 hours) shown in Table 1, followed by measuring the humidity resistance of the laminate by the method described previously in conjunction with Table 1. Blistering was not recognized at all in the multi-layered laminate tested.

As described above, the present invention provides a halogen-free epoxy resin composition exhibiting an excellent flame retardancy. The epoxy resin composition of the present invention can be used for manufacturing a copper-clad glass epoxy laminate. Further, a printed wiring board excellent in various properties can be manufactured by using the copper-clad laminate.

What is claimed is:
1. A halogen-free flame-retardant epoxy resin composition, comprising:
(A) a bisphenol A epoxy resin;
(B) a novolak epoxy resin;
(C-1) a reactive phosphoric acid ester;
(C-2) a curing agent of nitrogen-containing phenolic resin prepared by the co-condensation of a phenolic compound, a guanamine compound, and an aldehyde compound in the presence of an acid catalyst;
(D) a curing accelerator; and
(E) an inorganic filler.
2. The resin composition according to claim 1, wherein said reactive phosphoric acid ester (C-1) is represented by the formula:

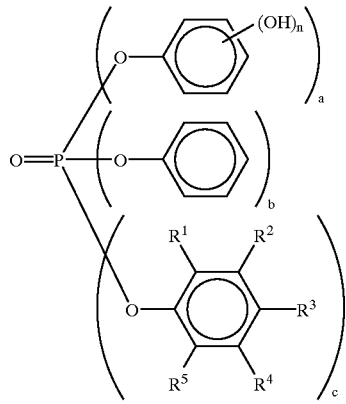

where a+b+c=3; a is 1, 2 or 3; b is 0, 1 or 2; c is 0, 1 or 2; n is 1 or 2; and each of $R^1$, $R^2$, $R^3$, $R^4$ and $R^5$ is a hydrogen atom or an alkyl group, at least one of these $R^1$ to $R^5$ being an alkyl group.

3. A prepreg comprising a glass substrate impregnated with the epoxy resin composition according to claim 1.

4. A prepreg comprising a glass substrate impregnated with the epoxy resin composition according to claim 2.

* * * * *

UNITED STATES PATENT AND TRADEMARK OFFICE
CERTIFICATE OF CORRECTION

PATENT NO. : 6,214,455 B1　　　　　　　　　　　　　　　　　　　　Page 1 of 1
DATED : April 10, 2001
INVENTOR(S) : Nobuyuki Honda, Tsuyoshi Sugiyama and Tetsuaki Suzuki It is certified that error appears in the above-identified patent and that said Letters Patent is hereby corrected as shown below:

<u>Title page, Item [54] Title, and Column 1, lines 1-3,</u>
"BISPHENOL A AND NOVOLAK EPOXY RESINS WITH NITROGEN-CONTAINING PHENOLIC RESIN" should read -- HALOGEN-FREE FLAME-RETARDANT EPOXY RESIN COMPOSITION AS WELL AS PREPEG AND LAMINATE CONTAINING THE SAME --.

Signed and Sealed this

Twenty-sixth Day of March, 2002

*Attest:*

*Attesting Officer*

JAMES E. ROGAN
*Director of the United States Patent and Trademark Office*